US006347382B1

(12) United States Patent
Nakayama et al.

(10) Patent No.: US 6,347,382 B1
(45) Date of Patent: Feb. 12, 2002

(54) MULTI-PORT DEVICE ANALYSIS APPARATUS AND METHOD

(75) Inventors: Yoshikazu Nakayama, Konosu; Norihide Abiko, Gyoda, both of (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/201,302

(22) Filed: Nov. 30, 1998

(51) Int. Cl.[7] .................................................. H02H 3/05
(52) U.S. Cl. ............................ 714/37; 712/20; 711/100
(58) Field of Search ................................ 714/37, 25, 1, 714/736; 712/20, 14, 15; 711/100; 370/241; 716/4

(56) References Cited

U.S. PATENT DOCUMENTS 4,982,164 A * 1/1991 Schiek et al. ............... 324/638
5,365,514 A * 11/1994 Hershey et al. ............. 370/241
5,578,932 A * 11/1996 Adamian .................... 324/601
5,794,008 A * 8/1998 Meyers et al. .............. 395/500
6,000,041 A * 12/1999 Baker et al. .................. 714/39
6,065,137 A * 5/2000 Dunsmore et al. ............ 714/37
6,147,501 A * 11/2000 Chodora ..................... 324/601

* cited by examiner

*Primary Examiner*—Robert Beausoleil
*Assistant Examiner*—Rita Ziemer
(74) *Attorney, Agent, or Firm*—Muramatsu & Associates

(57) ABSTRACT

A multi-port device analysis apparatus for analyzing the characteristic of a multi-port device having three or more input-output terminals. The multi-port device analysis apparatus is configured such that a test signal is sent from one port and an input signal is received by the other port. The apparatus includes a network analyzer for analyzing the characteristic of the multi-port device under test in vector values and a multi-port test set is connected to the ports of the network analyzer for converting the ports of the network analyzer to three or more ports. The multi-port device under test is connected to the multi-port test set without using a balance-unbalance converter to analyze the characteristic data of the device in vector values.

8 Claims, 6 Drawing Sheets

MULTI-PORT DEVICE ANALYSIS APPARATUS AND METHOD

FIELD OF THE INVENTION

This invention relates to a multi-port device apparatus and method for analyzing the characteristics of the multi-port device having three or more input-output terminals, and more particularly, to a multi-port device analysis apparatus and method which is capable of analyzing the multi-port device having a balanced input-output terminal or a multi-port device having different input-output impedance by using a conventional unbalanced two port type network analyzer and a conventional unbalanced multi-port test set having three or more ports.

BACKGROUND OF THE INVENTION

In order to analyze the characteristics of the communication devices or communication components used in various communication systems, a network analyzer is frequently used. A network analyzer obtains the data of various test parameters, such as a transfer function, reflection characteristics or a group delay of a high frequency components (device under test) used in a communication system by observing the frequency response of the high frequency components resulted in response to a sweep frequency signal.

A network analyzer is usually comprised of two ports, one input port and one output port. The input port sends a sweep frequency signal (test signal) to the device under test and the output port receives the response output signal of the device under test. The input port and the output port of the network analyzer are usually organized such that either port can be switched to the other by a switching operation. An example of schematic structure of such a network analyzer is shown in the block diagram of FIG. 1.

The configuration and operation of the network analyzer which is shown in FIG. 1 is briefly explained. A network analyzer 10 has two input-output ports P1 and P2 which are connected to bridges (or directional couplers) 11 and 12, respectively. Each of the bridges 11 and 12 functions as a signal separation circuit. A test signal from a signal generator 15 is sent to one of either the bridge 11 or bridge 12 which is selected by a switch 13. The test signal is sent from the selected one of the port P1 or port P2 to the device under test. The test signal from the signal generator 15 is also sent to the inside of the network analyzer as a reference signal. Namely, this reference signal and the input signal from the bridge are respectively provided to frequency converters 17, 18 and 19 whereby converted to signals of lower frequencies. The frequency converted input signal and the reference signal are respectively converted to digital signals by corresponding AD converter 21, 22 and 23. These digital signals are processed by a digital signal processor (DSP) 25 to obtain those data such as transfer functions, scattering parameters, and group delays. The data showing these characteristics are displayed by a display 29 in various formats under the control of a CPU 28 which controls the overall operation of the system.

The devices to be tested, which are components such as used in the communication systems, are sometimes formed with not only two terminals but also three or four terminals (hereinafter may be referred to as "multi-port device" if necessary). In order to analyze the characteristic of the multi-port devices by using the network analyzer comprising two ports, the measurement can be performed by terminating either one of the terminals of the device 30 to be tested by the characteristic impedance as shown in FIG. 2A. However, since this configuration causes various problems, the configuration using a multi-port test set as shown FIG. 2B is employed. The multi-port test set is provided between the two port network analyzer and the multi-port device to perform the characteristic analysis of the multi-port device accurately as well as easily. The connections of the components among the multi-port test set 20, the network analyzer 10 and the multi-port device 30 are shown in FIG. 2B. In this example, the multi-port test set 20 includes four input-output ports Q1–Q4.

In the network analyzer or the multi-port test set in a high frequency band as described above, each of the ports is in an unbalanced form and the input-output impedance is fixed to 50 ohm (or 75 ohm). Also, in the past, most of the conventional devices to be tested are configured in the unbalanced form with the impedance of 50 ohm. However, owing to the recent development of the semiconductor technology as well as the advancement and complication in the communication system, some of the recent multi-port devices to be tested employ the configurations which are different from that of conventional devices to be tested. An example of a basic structure of such a multi-port device 40 is shown in the circuit diagram of FIG. 3. In this example, an input terminal T1 is an unbalanced type and its impedance is 50 ohm while between output terminals T2 and T3 is formed of a balanced type with an impedance of 150 ohm.

Under the conventional technology, the testing of the balanced type multi-port device having a relatively high impedance as described above by using an unbalanced type network analyzer or a multi-port test set having a low impedance is performed according to the configuration as shown in FIG. 4. Namely, a balance-unbalance converter 42 is connected to the device 40 to be tested thereby converting a balanced output of the device to be tested to an unbalanced output. The input terminals T4 and T5 of the converter 42 are a balanced type and have 150 ohm impedance therebetween, and are connected to the output terminals T2 and T3 of the device 40 to be tested, respectively. The output terminal T6 of the converter 42 is formed as an unbalanced type and has an impedance of 50 ohm. Accordingly, the characteristic of the device to be tested is obtained by connecting the input terminal T1 and the output terminal T6 to the network analyzer.

According to the conventional measuring method using this converter, the measured value of the device under test 40 alone cannot be obtained because the measured result includes the characteristics of the balance-unbalance converter 42. In addition, owing to the use of the converter 42, even though the characteristic of the input terminal T1 and the output terminal T6 and the characteristic between these two terminals can be measured, the characteristic of other terminals cannot be obtained. For example, the characteristic of the balanced output terminals of the device under test cannot be obtained. In addition, because the balance-unbalance converter 42 needs to have the function to convert the output impedance of the device to be tested into the impedance of the multi-port test set 20 or the Network analyzer 10, it is necessary to prepare various kinds of converters in accordance with the impedance value of the devices to be tested.

SUMMARY OF THE INVENTION

Therefore, it is an object of the present invention to provide a multi-port device analysis apparatus and method which is capable of accurately measuring a multi-port device under test having an input-output terminal structure or an impedance different from that of the conventional devices to be tested.

It is another object of the present invention is to provide a multi-port device analysis apparatus and method which is capable of measuring a multi-port device having a balanced output ports without using a balance-unbalance converter.

It is a further object of the present invention is to provide a multi-port device analysis apparatus and method which is capable of measuring a multi-port device having a balanced port by using a multi-port test set or network analyzer having unbalanced input-output ports.

It is a further object of the present invention is to provide a multi-port device analysis apparatus and method which is capable of measuring a multi-port device having a impedance different from the impedances of the multi-port test set or net work analyzer by using such a multi-port test set and a network analyzer.

In order to test the multi-port device having three or more ports, the multi-port device analysis apparatus of the present invention is comprised of:

a network analyzer organized such that one port produces a test signal while the other port receives an input signal to analyze the characteristic of a device under test in vector values;

a multi-port test set connected to the ports of the network analyzer for converting the ports of the network analyzer to three or more of the ports by a switch provided therein;

wherein the multi-port device under test is connected to the multi-port test set without using a balance-unbalance converter thereby analyzing the characteristic data of the device in vector values.

Further, the multi-port device analysis apparatus of the present invention performs a calibration process of the analysis apparatus including cables connecting the multi-port device to be tested in a state where the network analyzer and the multi-port test set are connected with each other, stores the error correction data thus obtained in the network analyzer, and connects the multi-port device to be tested to the multi-port test set without using a balance-unbalance converter to obtain the characteristic vector data of the device, and analyzes the device by performing the error correction of the characteristic vector data by applying the error correction data.

Further, the multi-port device analysis apparatus of the present invention analyzes the multi-port device under test by obtaining the characteristic vector data at each terminal of the multi-port device under test and converting the vector data at each terminal into the data corresponding to the optional impedance value. Also, the multi-port device analysis apparatus analyzes the characteristic of the device under test by obtaining the characteristic vector data at each unbalanced terminal and converting such vector data at each unbalanced terminal into balanced terminal data between two optional terminals.

DETAILED DESCRIPTION OF THE EMBODIMENTS

Figure 3:
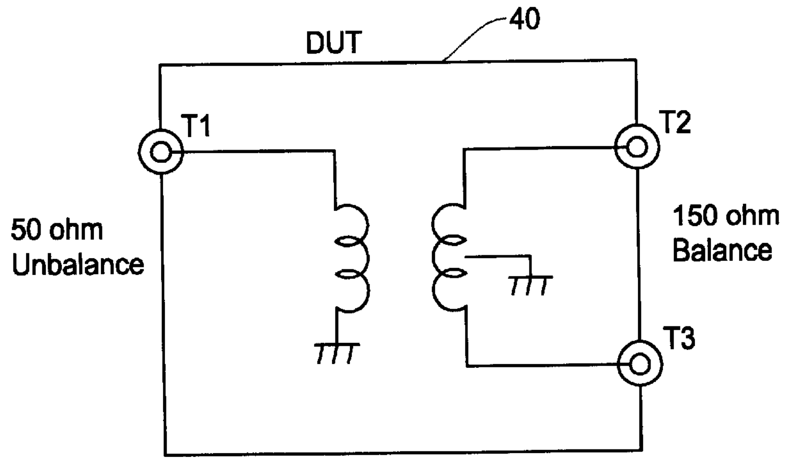
FIG. 3 is a circuit diagram showing an example of the configuration of the multi-port device to be measured by the multi-port device analysis apparatus of the present invention.
Figure 4:
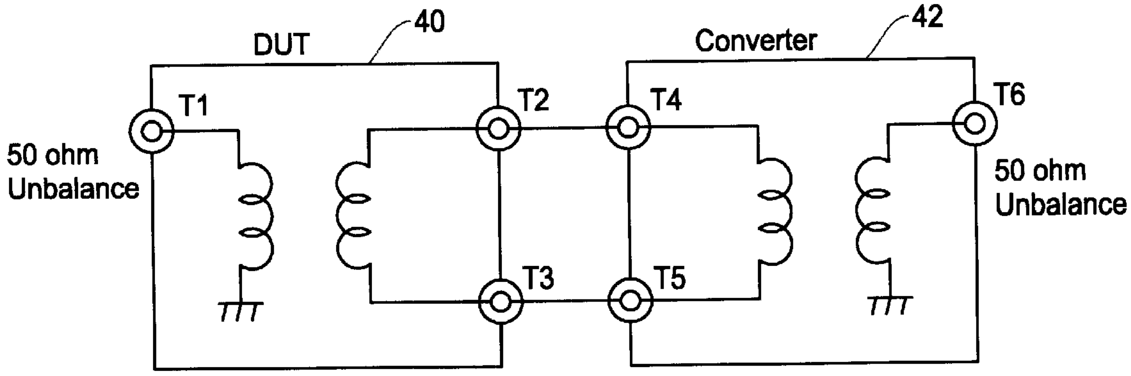
FIG. 4 is a circuit diagram showing an example of the configuration for measuring a multi-port device of FIG. 3 by using a balance-unbalance converter in accordance with the conventional technology.
Figure 5:
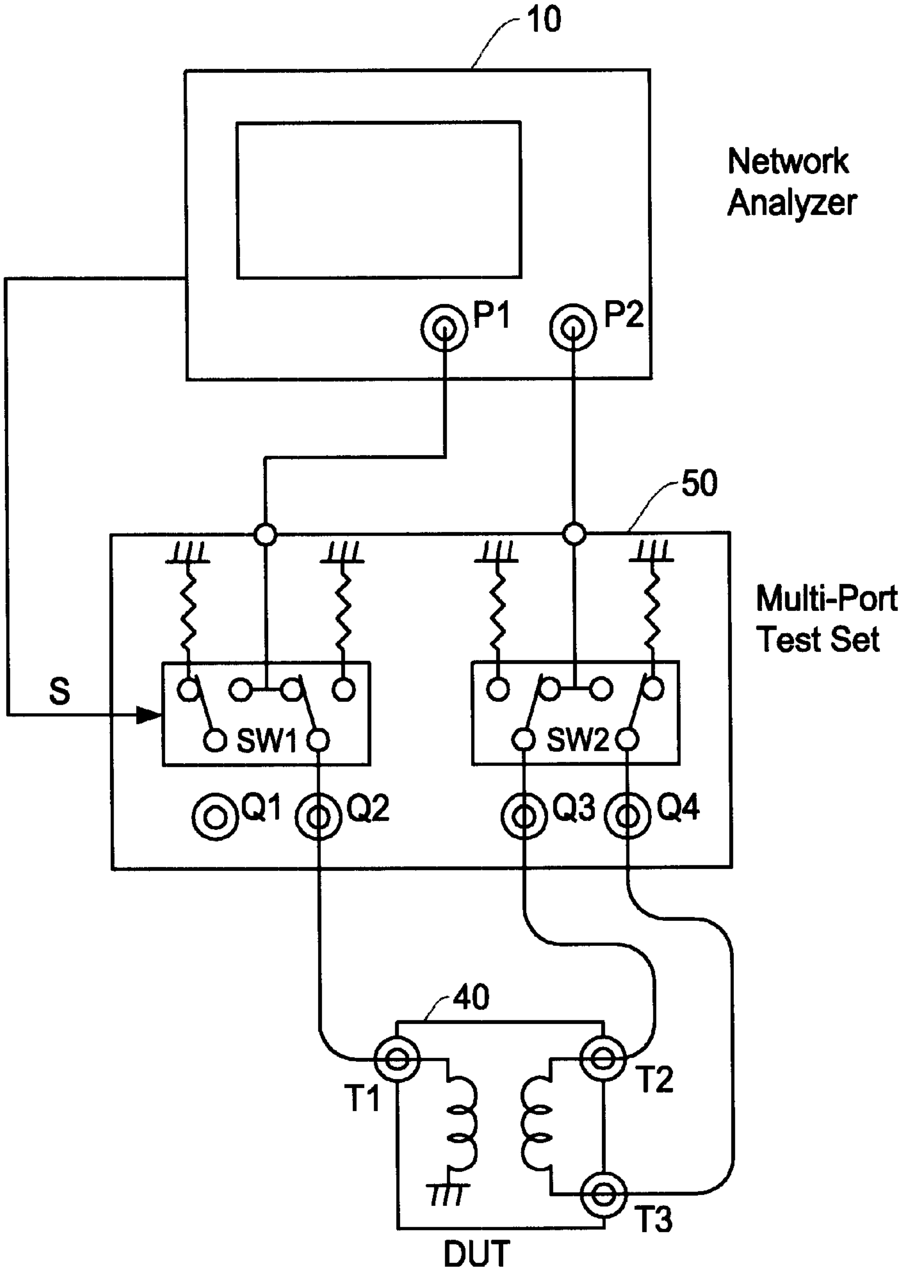
FIG. 5 is a block diagram showing an example of a basic structure for measuring the multi-port device as shown in FIG. 3 by the multi-port device analysis apparatus of the present invention.

The preferred embodiments of the present invention will be described with reference to the drawings. FIG. 5 is a block diagram showing an example of a basic structure for measuring the multi-port device such as shown in FIG. 3 by the multi-port device analysis apparatus of the present invention. In this example, each of the input and output ports of the network analyzer 10 and the multi-port test set 50 is an unbalanced type and an impedance is 50 ohm, for example. On the other hand, the multi-port device 40 that is to be tested has an unbalanced input and a balanced output and its output impedance is 150 ohm.

Figure 2A:
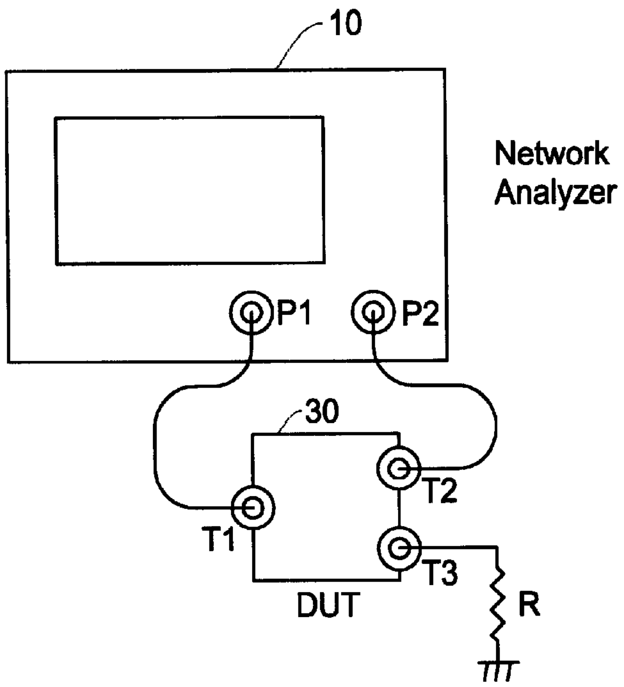
FIG. 2A is a block diagram showing a basic structure for measuring the multi-port device by the two port network analyzer.
Figure 2B:
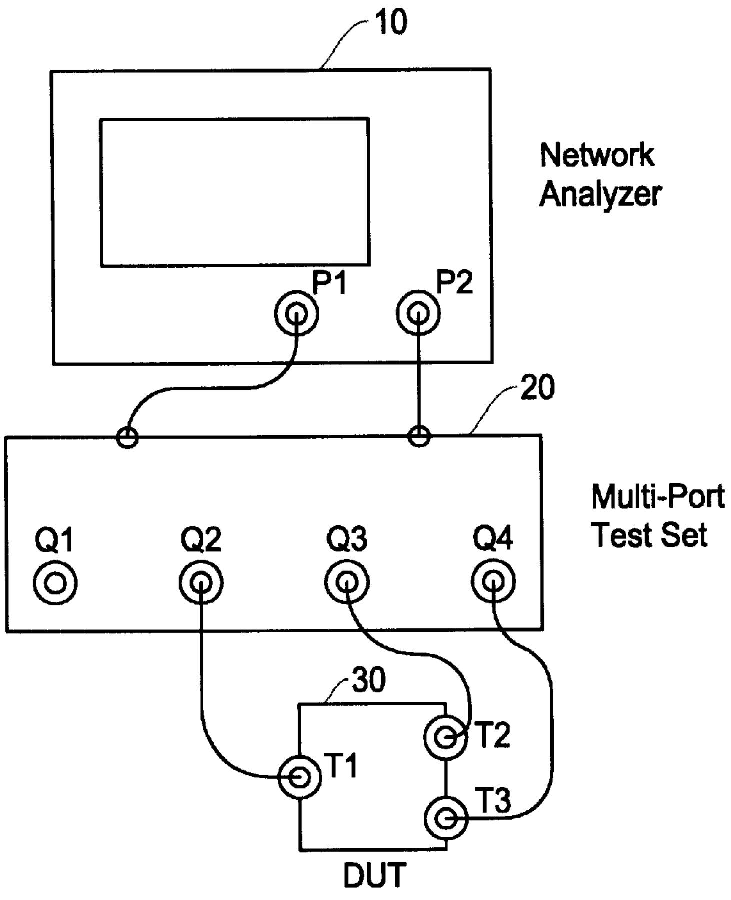
FIG. 2B is a block diagram showing a basic structure for measuring the multi-port device by combining the multi-port test set and the network analyzer of FIG. 1.

Like the example in FIG. 2B, the multi-port test set 50 is connected to the network analyzer having two ports P1 and P2 to form three or more input and output ports Q1–Q4. The multi-port device 40 to be tested is directly (without using a balance-unbalance converter) connected to the input and output ports of the multi-port test set 50 and various kinds of data are obtained in this arrangement by the network analyzer 10. The multi-port test set 50 in this example have two built-in switches, and each of them is controlled by the control signal S from the network analyzer 10. One of the port of the network analyzer is a signal source output port, and the other port is a signal input port. The network analyzer 10 can interchangeably switch the signal source output port and signal input port.

Prior to measuring the multi-port device under test, it is preferable to conduct an error correction by performing a calibration process. For this purpose, for instance, one end of each of the cables to be connected to the device under test is set to the states of an open, short or characteristic impedance termination, and vector value of each scattering (S) parameter at each state is obtained, and such vector value is stored in a memory (not shown) in the network analyzer as error correction data.

Next, the multi-port device 40 that is to be tested is connected to each of the cables. The input terminal T1 of the multi-port device 40 to be tested is provided with the input signal from port P1 of the network analyzer through port Q2 of the multi-port test set 50. The balanced output terminal T2 of the device under test 40 is connected to the input port P2 of the network analyzer through Port Q3 of the multi-port test set 50. The other balanced output terminal T3 of the device under test is terminated by a predetermined impedance value which is 50 ohm by the multi-port test set 50. Under this arrangement, a transfer function and each of the scattering (S) parameters are measured by the network analyzer 10. Further, the balanced output terminal T2 is connected to the termination resistance 50 ohm by changing the switch 2, and the balanced output terminal T3 is connected to the input port P2 of the network analyzer through port Q4 of the multi-port test set. Under this arrangement, a transfer function and each of the scattering parameters are measured by the network analyzer 10.

Figure 1:
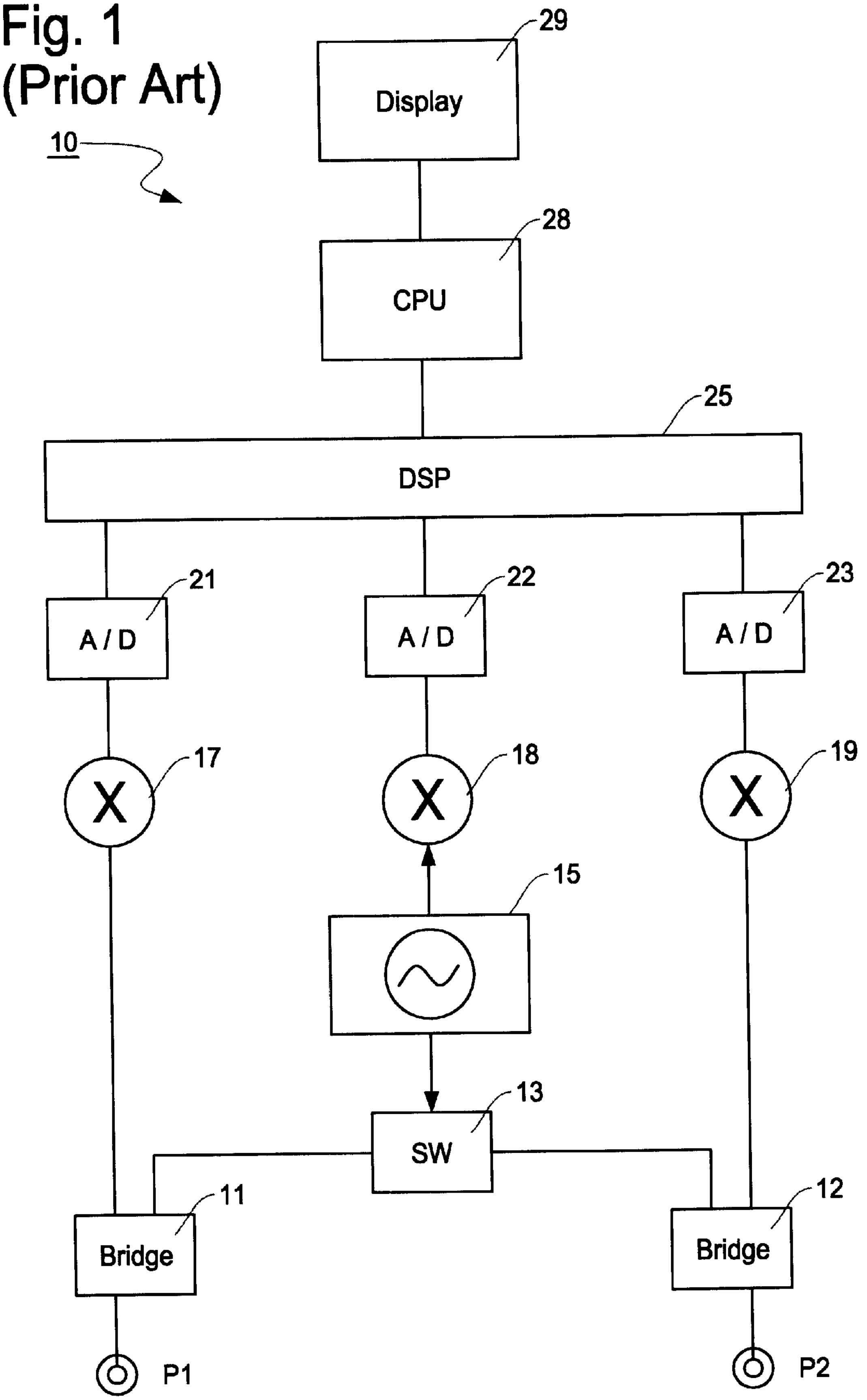
FIG. 1 is a block diagram showing an example of a basic structure of a generally used network analyzer having two input-output ports.

These measured values are obtained as vector values containing not only absolute values but also with the phase values, and are stored in the memory (not shown) to be signal-processed by the DSP or CPU 28 of FIG. 1. By using the error correction data obtained in advance, correction of the measured vector values is performed. Among the signal processing by the DSP or the like, the feature of the present invention includes an impedance conversion process and an unbalance-balance conversion process.

The impedance conversion process is a calculation process which converts the measured values obtained by the above noted arrangement into measured values of a different impedance base. As described above, the network analyzer 10 and the multi-port test set 50 are comprised of the impedance of 50 ohm base, and the output impedance of the device under test 40 is 150 ohm. Therefore, the measured values obtained by the above arrangement is the one obtained under the condition where the impedance is unmatched. This measured values are converted to measured values of the impedance matched situation, that is, the state where the impedances of the multi-port test set and the network analyzer are assumed to be 150 ohm. The results of the conversion process is displayed on the display.

The unbalance-balance conversion process is a computation process which converts the measured values obtained by the above arrangement into measured values corresponding to a balanced output. As described above, each port of the network analyzer 10 and the multi-port test set 50 is the unbalanced type, and the output of the device to be tested is the balanced type. Therefore, the measured values obtained by the above configuration are converted through the computation process to measured values which would be obtained from a balanced type output terminal, i.e., the measured value to be obtained between the output terminals T2 and T3 of the multi-port device 40 to be tested. The result of the conversion operation is displayed on the display.

Figure 6:
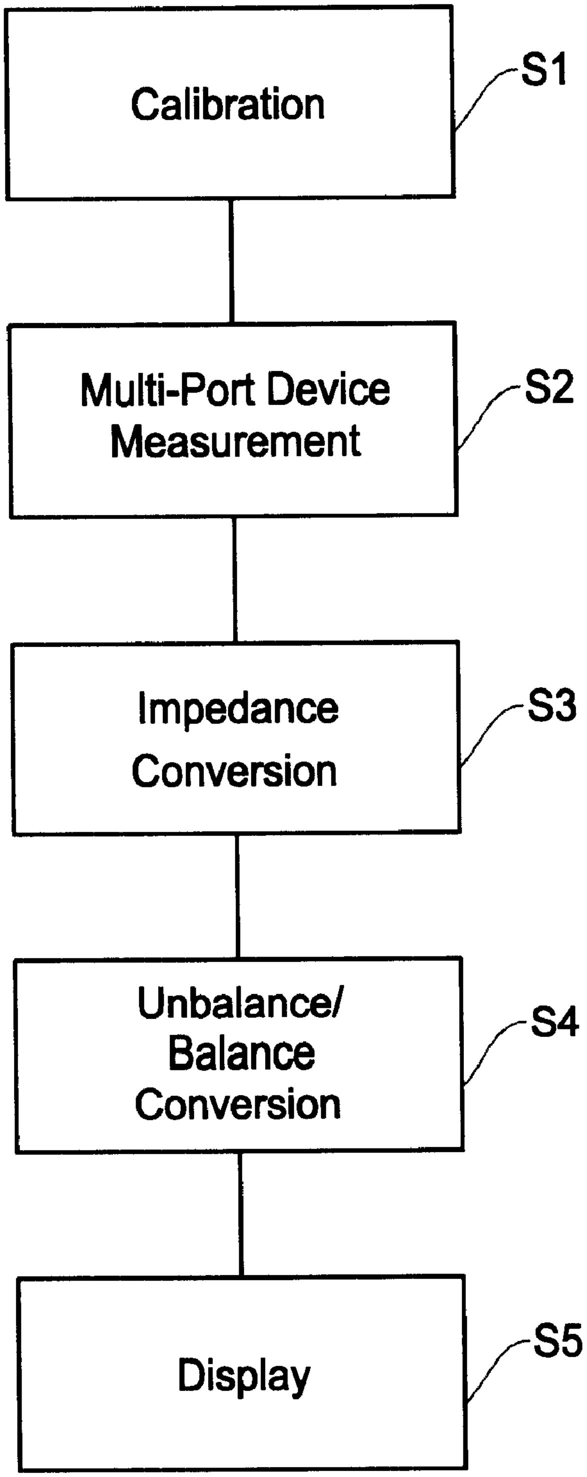
FIG. 6 is a flow chart showing a measuring process by the multi-port device analysis apparatus of the present invention.

FIG. 6 is a flow chart showing the measurement process by the multi-port device analysis apparatus of the present invention. In the step S1, the calibration is performed for the whole measurement system including the network analyzer, multi-port test set, and measurement cables and the like. The error correction data thus obtained is stored in the memory of network analyzer and is used to correct the measured data at the time such actual measurement data is obtained. In the step S2, the characteristics measurement of the multi-port device under test is performed according to the configuration of FIG. 5 to obtain vector data. The representative measurement data includes S parameters, which is stored in the memory of the network analyzer to be undertaken the error correction process with the use of the above noted error correction data.

The error corrected measurement data is processed by the impedance conversion process in the step S3. By this process, the measured data obtained by the 50 ohm base is converted to the data which matches the impedance of the multi-port device to be tested. Further, in the step S4, the unbalance-balance conversion process is performed. By this process, the measured data obtained by connecting the output terminals of the device under test to the unbalanced terminals is converted to the output characteristic data between the balanced terminals of the multi-port device under test. The order of processes, i.e., which one of the impedance conversion process or unbalance-balance conversion operation should be preceded, has no consequence. The data obtained by this conversion processing is displayed by the network analyzer in the step S5.

Figure 7:
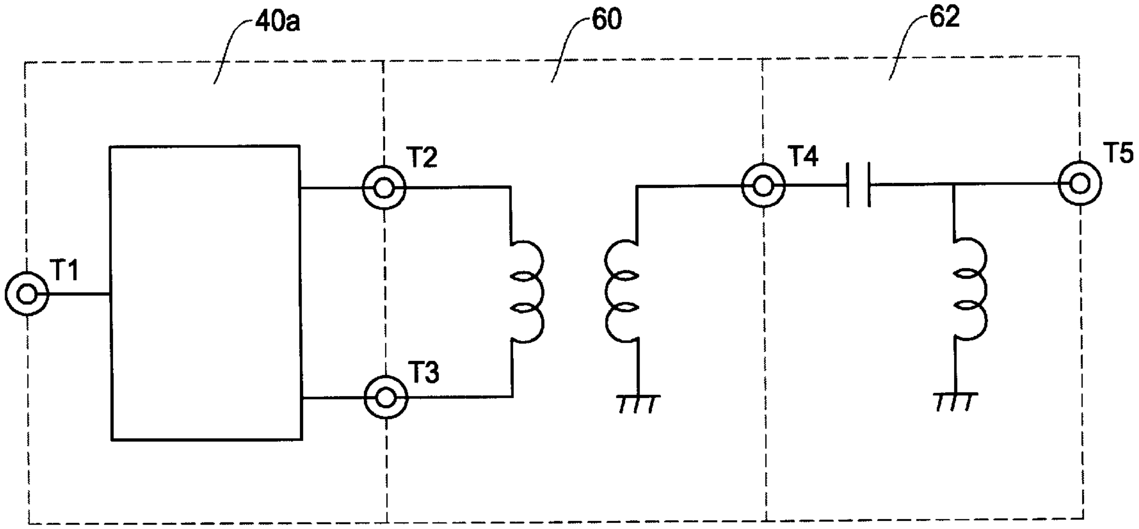
FIG. 7 is a circuit diagram showing the concept of calculation such as an impedance conversion and a balance-unbalance conversion in the present invention.
Figure 8:
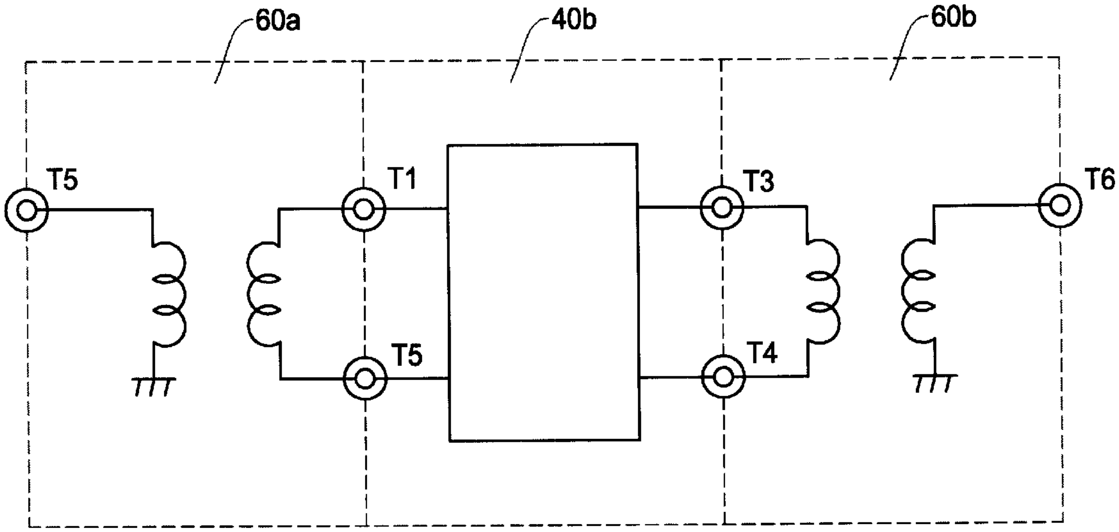
FIG. 8 is a circuit diagram showing the concept of calculation such as an impedance conversion and a balance-unbalance conversion according to the present invention.

The impedance conversion operation and unbalance-balance conversion operation noted above are further described with more specificity. FIGS. 7 and 8 are circuit diagrams showing the concepts of these conversion processes. Although a port number conversion circuit 60 and a matching circuit 62 are connected to a multi-port device 40*a* to be tested in FIG. 7, these additional circuits are not physical ones, but are rather imaginary circuits showing only the concept of conversion computation. Similarly, although port number conversion circuits 60*a* and 60*b* are connected to the multi-port device 40 to be tested, these additional circuits are not physical circuits but rather imaginary circuits showing only the concept of conversion computation. The example of FIG. 8 shows the situation where the multi-port device 40*b* to be tested has a balanced type input terminal and a balanced type output terminal.

An example of the impedance conversion operation is as follows. As in the foregoing, the input terminal T1 of the multi-port device 40*a* of FIG. 7 has an unbalanced type 50 ohm input terminal T1, and a balanced type 150 ohm output terminal between terminals T2 and T3. It is assumed that S parameters at each terminal is measured by the multi-port test set 50 and network analyzer 10 having the unbalanced 50 ohm ports. In this situation, the measured S parameters are converted to the S parameters which would be obtained where the respective impedances of output terminals T2 and T3 are unbalanced terminals having an impedance of 75 ohm. After the conversion process is completed, an impedance between the output terminal T2 and T3 becomes equivalent to the unbalanced terminal having an impedance of 150 ohm.

Generally, in an n port circuit network, assuming that a matrix of S parameters are denoted by S when normalized impedances are Z1, Z2, . . . , Zn, and a matrix of S parameters are denoted by S" when normalized impedances are Z1", Z2", . . . , Zn", the S parameter S" is calculated according to the following formula:

$$S''=B(I-S)^{-1}(D+SC)(C+SD)^{-1}(I-S)A$$

In the above formula, A , B, C and D are the following matrixes, and I is a unit matrix.

$$A = \begin{bmatrix} \sqrt{\frac{Z1''}{Z1}} & 0 & \cdots & 0 \\ 0 & \sqrt{\frac{Z2''}{Z2}} & \cdots & 0 \\ \cdots & \cdots & \cdots & \cdots \\ 0 & 0 & 0 & \sqrt{\frac{Zn''}{Zn}} \end{bmatrix}$$

$B=A^{-1}$ $C=B+A$ $D=B-A$

Therefore, in the above equations, by applying measured values of the S parameters in the matrix S, and substituting the impedance Z1 . . . Zn before conversion and the impedance Z1" . . . Zn" after conversion, the S" parameters after the impedance conversion is obtained. In the example of FIG. 7, the S parameter S" is calculated by setting Z1, Z2 and Z3 to 50 ohm, and setting Z1" to 50 ohm, Z2 and Z3 to 75 ohm, respectively. By doing so, the S parameters for the output impedance of 150 ohm is obtained. The foregoing is an example of impedance conversion process according to the present invention.

An example of balance-unbalance conversion process according to the present invention is explained below. As shown in FIGS. 7 and 8, the conversion of the balanced terminals of the device under test 40*a* or 40*b* to the unbalanced terminals is equivalent to conversion of the number of ports by the imaginary port number conversion circuit 60, 60*a* and 60*b*. For example, while the number of ports of the device under test 40*a* is three, this number of ports is converted to two, as a whole, by the Port number conversion circuit 60. In this situation, the matrix of the S parameters of the device under test 40*a* having three ports (in the above example, the normalized impedance is Z1=50 ohm, Z2=75 ohm, and Z3=75 ohm) is expressed as follows:

$$\begin{pmatrix} S11 & S12 & S13 \\ S21 & S22 & S23 \\ S31 & S32 & S33 \end{pmatrix}$$

The matrix of the S parameters of the three port circuit network is converted to a two port circuit network (in the above example, the normalized impedance is Z1=50 ohm, Z2+Z3=150 ohm) and is expressed as follows:

$$\begin{pmatrix} S11'' & S12'' \\ S21'' & S22'' \end{pmatrix}$$

The S parameters S11", S12", S21", and S22" in the above matrix are expressed as follows:

$$S11''=S11+1/\Delta(S13\sqrt{Z2}+S12\sqrt{Z3})(S31\sqrt{Z2}+S21\sqrt{Z3})$$

$$S12''=1/\Delta\sqrt{Z2+Z3}\{[S12(1-S33)+S13S32]\sqrt{Z2}-[S13(1-S22)+S12S23]\sqrt{Z3}\}$$

$$s21''=1/\Delta\sqrt{Z2+Z3}\{[S21(1-S33)+S23S31]\sqrt{Z2}-[S31(1-S22)+S32S21]\sqrt{Z3}\}$$

$$S22''=1/\Delta\{[S22(1-S33)+S23S32]Z2+[S33(1-S22)+S23S32]Z3-(S23+S32)\sqrt{Z2}\sqrt{Z3}\}$$

$$\Delta=(1-S33)Z2+(1-S22)Z3-(S23+S32)\sqrt{Z2}\sqrt{Z3}$$

By using each of the above equations, a three port circuit network is converted to a two port circuit network. Therefore, in FIG. 7 for example, S parameters between the terminals T1 and T4 are obtained. As described above, it should be noted that the port number conversion circuit 60 in this case is an imaginary circuit for introducing the calculation formula. Further, it goes without saying that the matching circuit 62 is also an imaginary circuit which shows the concept for performing the impedance matching through a calculation process. In the example of FIG. 8, the multi-port device 40*b* under test is a four port circuit and for that reason port number conversion circuits are provided both at an input side and an output side. The impedance conversion process and the balance-unbalance conversion process in this situation are basically the same as that of FIG. 7 except that the numerical formula becomes more complicated.

As described above, according to the multi-port device analysis apparatus of the present invention, it is possible to accurately measure the multi-port device under test having the input-output terminal structure or impedance which is different from that of the conventional devices to be tested. Also, it is possible to measure the multi-port device having balanced output without using a balance-unbalance converter. Further, it is possible to measure the multi-port device having balanced terminals by using a multi-port test set and a network analyzer both of which have unbalanced input and output ports. According to the multi-port device analysis apparatus of the present invention, by using a multi-port test set and a network analyzer both of have input and output ports of predetermined impedances, it is possible to measure the multi-port device having impedances different from that of the test set and network analyzer.

What is claimed is:

1. A multi-port device analysis apparatus for testing a multi-port device having three or more terminals, comprising:

a network analyzer which sends a test signal from one port and receives an output signal at other port for analyzing the characteristic of a multi-port device under test by vector values; and a multi-port test set connected to the ports of the network analyzer for converting the ports of the network analyzer to three or more ports by a switch provided therein;

wherein the multi-port device under test is directly connected to the multi-port test set and data showing the characteristics of the multi-port device is analyzed in vector values;

and wherein vector data of the characteristic at each terminal of the multi-port device under test is obtained and the vector data at each terminal is converted to data which corresponds to an optional impedance value to analyze the multi-port device under test.

2. A multi-port device analysis apparatus as defined in claim 1, wherein vector data of the characteristic at each terminal of the multi-port device under test is obtained and the vector data at each terminal is converted to data of a balanced terminal formed by two optional terminals to analyze the multi-port device under test.

3. A multi-port device analysis apparatus as defined in claim 1, wherein vector data of the characteristic at each terminal of the multi-port device under test is obtained, and the vector data at each terminal is converted to data which corresponds to an optional impedance value, and the vector data at each unbalanced terminal of the multi-port device under test is converted to data of a balanced terminal formed by two optional terminals to analyze the multi-port device under test.

4. A multi-port device analysis apparatus for testing a multi-port device having three or more terminals, comprising:

a network analyzer which sends a test signal from one port and receives an input signal at other port for analyzing the characteristic of a multi-port device under test by vector values; and a multi-port test set connected to the ports of the network analyzer for converting the ports of the network analyzer to three or more ports by a switch provided therein;

wherein the multi-port device under test is directly connected to the multi-port test set without using a balance-unbalance converter and the vector data at each terminal is converted to data corresponding to an optional impedance value to analyze the multi-port device under test.

5. A multi-port device analysis apparatus for testing a multi-port device comprising three or more terminals, comprising:

a network analyzer which sends a test signal from one port and receives an input signal at other port for analyzing the characteristic of a multi-port device under test by vector values; and a multi-port test set connected to the ports of the network analyzer for converting the ports of the network analyzer to three or more ports by a switch provided therein;

wherein the multi-port device under test is directly connected to the multi-port test set without using a balance-unbalance converter and the vector data at each terminal is converted to data between two optional terminals to analyze said multi-port device under test.

6. A multi-port device analysis for testing a multi-port device comprising three or more terminals, comprising the steps of:

providing a network analyzer which sends a test signal from one port and receives an input signal at other port for analyzing the characteristic of a multi-port device under test by vector values;

providing a multi-port test set connected to the ports of the network analyzer for converting the ports of the network analyzer to three or more ports by a switch provided therein;

connecting the network analyzer and the multi-port test set and connecting the multi-port device under test to the multi-port test set through cables;

performing calibration to obtain error correction data and storing the correction data thus obtained in the network analyzer;

directly connecting the multi-port device under test to the multi-port test set through the cables to obtain the characteristic data of the multi-port device under test in vector values;

analyzing the multi-port device under test by applying the error correction data to perform an error correction process on the characteristic vector data; and obtaining vector data of the characteristic at each terminal of the multi-port device under test and converting the vector data at each terminal to data which corresponds to an optional impedance value to analyze the multi-port device under test.

7. A multi-port device analysis method as described in claim 6, further comprising a step of obtaining vector data of the characteristic at each terminal of the multi-port device under test and converting the vector data at each terminal to data of a balanced terminal formed by two optional terminals to analyze the multi-port device under test.

8. A multi-port device analysis method as described in claim 6, further comprising a step of obtaining vector data of the characteristic at each terminal of the multi-port device under test, converting the vector data at each terminal to data which corresponds to an optional impedance value, and converting the vector data at each unbalanced terminal of the multi-port device under test to data of a balanced terminal formed by two optional terminals to analyze the multi-port device under test.

* * * * *